(12) United States Patent
Moosbrugger et al.

(10) Patent No.: US 7,265,719 B1
(45) Date of Patent: Sep. 4, 2007

(54) PACKAGING TECHNIQUE FOR ANTENNA SYSTEMS

(75) Inventors: Peter J. Moosbrugger, Erie, CO (US); Ryan S. Jennings, Louisville, CO (US); Bradley J. Tame, Thornton, CO (US)

(73) Assignee: Ball Aerospace & Technologies Corp., Boulder, CO (US)

( * ) Notice: Subject to any disclaimer, the term of this patent is extended or adjusted under 35 U.S.C. 154(b) by 0 days.

(21) Appl. No.: 11/382,908

(22) Filed: May 11, 2006

(51) Int. Cl.
*H01Q 1/38* (2006.01)
*H01Q 21/00* (2006.01)
*H01Q 1/34* (2006.01)

(52) U.S. Cl. .............................. 343/700 MS; 343/893
(58) Field of Classification Search ......... 343/700 MS, 343/893, 709
See application file for complete search history.

(56) References Cited

U.S. PATENT DOCUMENTS

| | | | |
|---|---|---|---|
| 4,791,421 A | 12/1988 | Morse et al. |
| 4,829,309 A | 5/1989 | Tsukamoto et al. |
| 4,888,597 A | 12/1989 | Rebiez et al. |
| 5,008,496 A | 4/1991 | Schmidt et al. |
| 5,121,297 A | 6/1992 | Haas |
| 5,144,534 A | 9/1992 | Kober |
| 5,235,736 A | 8/1993 | Hahs, Jr. et al. |
| 5,428,190 A | 6/1995 | Stopperan |
| 5,434,362 A | 7/1995 | Klosowiak et al. |
| 5,452,182 A | 9/1995 | Eichelberger et al. |
| 5,675,345 A | 10/1997 | Pozgay et al. |
| 5,838,285 A | 11/1998 | Tay et al. |
| 5,903,440 A | 5/1999 | Blazier et al. |
| 6,020,862 A | 2/2000 | Newton et al. |
| 6,023,243 A | 2/2000 | Frank |
| 6,111,549 A | 8/2000 | Feller |
| 6,181,282 B1 | 1/2001 | Gans et al. |
| 6,224,951 B1 | 5/2001 | Centanni et al. |
| 6,292,370 B1 | 9/2001 | Anderson et al. |
| 6,320,547 B1 | 11/2001 | Fathy et al. |
| 6,326,920 B1 | 12/2001 | Barnett et al. |
| 6,351,247 B1 | 2/2002 | Linstrom et al. |
| 6,356,166 B1 | 3/2002 | Goldsmith et al. |
| 6,362,780 B1 | 3/2002 | Butz et al. |

(Continued)

OTHER PUBLICATIONS

"Turnability—An Enabling Technology For Wireless." Agile Materials & Technologies, Inc. pp. 1-4. 2003.

*Primary Examiner*—Shih-Chao Chen
(74) *Attorney, Agent, or Firm*—Sheridan Ross P.C.

(57) ABSTRACT

A modular electronic architecture is provided. In particular, one or more unit sub-arrays providing at least a portion of the antenna radiator elements and supporting circuitry comprising at least part of a phased array antenna are provided. Each unit sub-array includes a first area comprising a rigid circuit board on which one or more antenna radiator elements are formed. In addition, a second area of rigid circuit board material for supporting circuitry is provided. The first and second areas are interconnected to one another by a region of flexible circuit board material having connective traces. Methods for forming unit sub-arrays providing antenna radiator elements and supporting circuitry are also provided. More particularly, a completed unit sub-array may be formed while the associated circuit boards are in a flat or planar condition. Following any desired verification of the operating status of the circuit board, supporting structure can be machined away, allowing the unit sub-array to be folded for inclusion in a phased array antenna assembly.

26 Claims, 11 Drawing Sheets

U.S. PATENT DOCUMENTS

| | | |
|---|---|---|
| 6,417,806 B1 | 7/2002 | Gothard et al. |
| 6,424,313 B1 | 7/2002 | Navarro et al. |
| 6,469,255 B2 | 10/2002 | Watanabe et al. |
| 6,477,052 B1 | 11/2002 | Barcley |
| 6,483,713 B2 | 11/2002 | Samant et al. |
| 6,611,230 B2 | 8/2003 | Phelan |
| 6,778,139 B2 | 8/2004 | Suzuki et al. |
| 6,841,739 B2 | 1/2005 | Moore |
| 6,914,324 B2 | 7/2005 | Rapport et al. |
| 6,914,566 B2 | 7/2005 | Beard |
| 6,937,192 B2 | 8/2005 | Mendolia et al. |
| 6,947,008 B2 | 9/2005 | Tillery et al. |
| 7,084,512 B2 * | 8/2006 | Higashida et al. .......... 257/777 |
| 2004/0020687 A1 | 2/2004 | Moore |
| 2004/0150561 A1 | 8/2004 | Tillery et al. |
| 2005/0170291 A1 | 8/2005 | Berg |
| 2005/0190104 A1 | 9/2005 | Coleman et al. |
| 2005/0221633 A1 | 10/2005 | Wildes et al. |

* cited by examiner

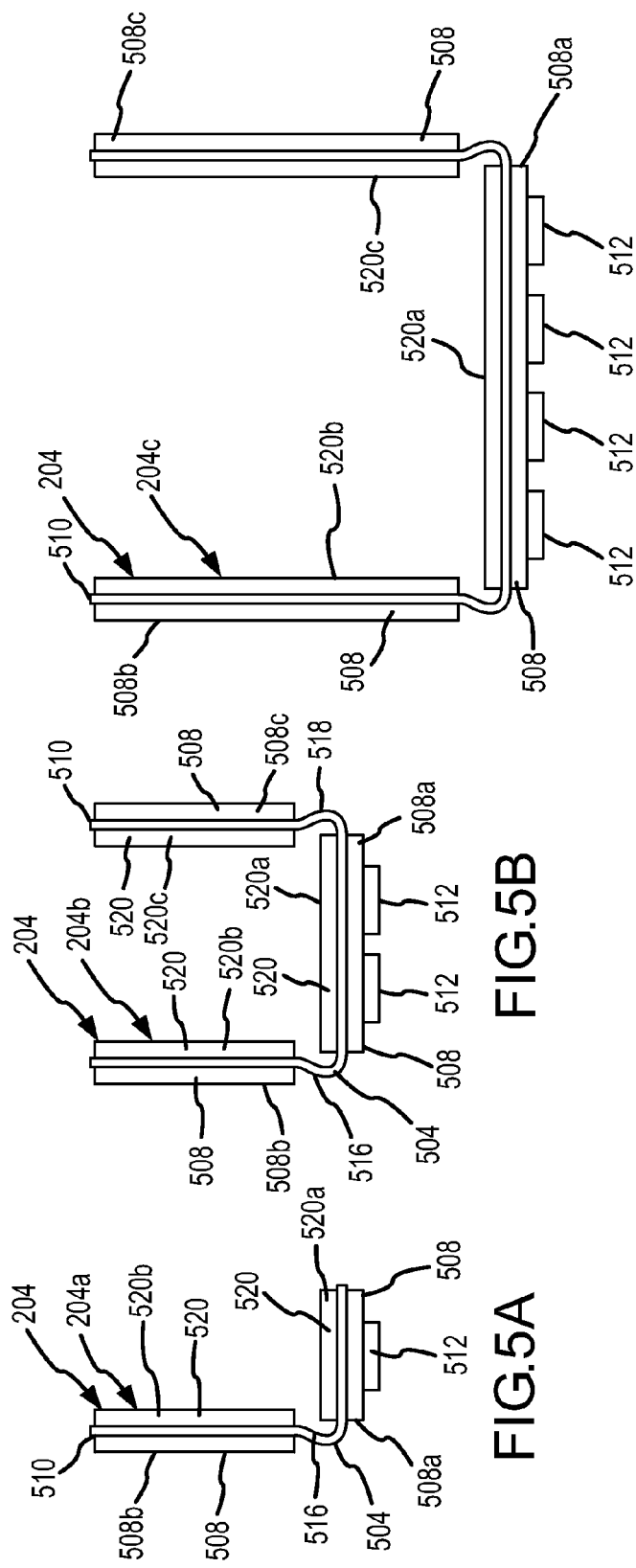

PACKAGING TECHNIQUE FOR ANTENNA SYSTEMS

FIELD OF THE INVENTION

The present invention is directed to a modular electronic architecture. In particular, the present invention facilitates the efficient production and testing of antenna system circuit assemblies.

BACKGROUND OF THE INVENTION

Electronic circuits typically include a number of components. These components can be discrete devices, or provided as part of integrated circuits. Whether provided as discrete devices or integrated circuits, multiple electronic components are often interconnected to one another by placing those components on a common printed circuit board. In addition to providing a structural member to which components can be attached, a printed circuit board typically provides traces on one or more layers to conduct power and signals to and between attached components. When used in connection with implementing complex circuits, the design of the individual circuit boards can also become quite complex. In addition, where a large number of components are to be interconnected to a printed circuit board, the area of the board can become quite large, and a relatively large number of layers may be required to provide the necessary connective traces. Certain electronic components can also be integrated directly into a printed circuit board.

One consideration in the design of electronic circuits is the size of those circuits. In particular, by making devices smaller, certain performance parameters can be improved, and the device can be easier to package and transport. Also, it can be desirable to maintain electronic circuitry within size limits that are defined by certain components of a device implemented using the electronic circuitry or a component of that circuitry.

One example of electronic circuitry that can be quite complex, but that is desirably deployed within a relatively small area, is a phased array antenna. In a phased array antenna, multiple antenna elements or radiators are deployed across a surface. The size of each antenna element is generally determined by the intended operating frequency or frequencies of the antenna. Furthermore, as more antenna elements are provided, the antenna beam can be more narrowly focused and directed by applying selected phased delays to the signal comprising the beam that is delivered to (or received from) each of the antenna elements. That is, by varying the delay of a signal, the corresponding beam can be scanned along one dimension for a one-dimensional array of antenna elements and along two dimensions for a two-dimensional array of elements. In addition, the maximum scanning angle that can be provided by an antenna will increase as the space between antenna elements is decreased. Accordingly, the radiator or antenna elements of a phased array antenna generally occupy an area that is defined by the size of the individual antenna elements, the number of antenna elements, and the spacing between antenna elements.

Within the area defined by the antenna elements of a phased array antenna, on a side of a circuit board opposite the side on which the antenna elements are formed, circuits have been developed that allow the phase delay of multiple separate beams to be controlled. However, where a phased array antenna is intended for simultaneous communications with or tracking of a larger number of targets, it is desirable to increase the number of beams that can be individually controlled. This has been difficult or impossible to achieve using conventional techniques in connection with the circuit board on which the antenna elements are formed. In addition, because higher frequencies generally require a smaller antenna element, it has been especially difficult to provide supporting circuitry for systems designed to operate at high frequencies.

In order to provide the area necessary for complex beam forming networks, additional circuit boards containing components of the beam forming network can be placed behind the board on which the antenna elements are formed, for example on circuit boards arranged perpendicular to the antenna element boards. That is, the space available for circuitry can be expanded into three dimensions. Although such systems provide a place for the circuitry required to provide a number of steered beams, they do not address issues of design difficulty and ease of expansion. In particular, each board or other unit of circuitry typically includes elements that are unique to that board.

In general, adding additional circuit boards behind these boards on which antenna elements are formed requires the use of mechanical interconnections between the boards, to support the transfer of electrical signals. Where the electrical signals are at radio frequencies, and/or where there are a large number of signals, the tolerances with which the mechanical interconnections must be manufactured and completed are particularly stringent. In addition, testing of the completed antenna assembly necessarily requires that the various interconnections be made. Accordingly, testing cannot be completed until the antenna assembly itself is completed. As a result, if defects in the assembly are found, the antenna assembly must be taken apart, and the defective components replaced or repaired. Following replacement or repair of defective components, the entire assembly must again be completed before further testing can be performed. As a result, the manufacture of phased array antennas capable of supporting multiple beams simultaneously, has remained difficult and expensive.

As an example of the size constraints that are placed on the available circuit board area in connection with a phased array antenna, at super high frequencies (SHF) the unit cell sizes of individual antenna elements are approximately 0.3 inch by 0.3. inch. This size constraint has led to the development of specialized monolithic microwave integrated circuits (MMICs) integration of the MMICs into a high tech module (e.g., co-fired ceramic substrate or other multichip module) and further integration of these modules into a subarray that requires sealing for protection from the environment. Due to the cost and complexity of these specialized circuits and packaging techniques required to support custom MMIC integration (ie., specialized production, specialized testing and specialized packaging), the manufacture of phased array antennas operating at high frequencies in particular remains expensive and difficult. Furthermore, the expense and difficulty of producing phased array antennas is even more expensive and difficult where MMIC components are provided in connection with multiple circuit boards that are interconnected to one another through complex, high quality connectors.

SUMMARY OF THE INVENTION

The present invention is directed to solving these and other problems and disadvantages of the prior art. In particular, embodiments of the present invention provide phased array antenna assemblies and methods for producing phased array antenna assemblies in which the unit cell area of an antenna radiator element is removed as a constraint in the phased array circuit design. More particularly, embodiments of the present invention provide for the formation of antenna radiator elements on a first rigid circuit board area that is interconnected to at least a second rigid circuit board area having a number of connective traces and component pads by a flexible circuit board having a number of connective traces. According to embodiments of the present invention, both the first rigid circuit board area containing the antenna radiator elements and the second rigid circuit board area containing component pads are laminated to the flexible circuit board having a number of connective traces. Accordingly, by placing components on the second rigid circuit board area, and by providing interconnections between those components and the radiator elements via connective traces formed on the flexible circuit board, the antenna elements can be interconnected to supporting circuitry that is at least in part formed in an area of a circuit board that is different from (e.g., greater than) the area of the circuit board containing the antenna elements. Furthermore, by providing an antenna assembly in which rigid circuit boards or circuit board areas are laminated to a common flexible circuit board, the need for a complex, high tolerance and expensive mechanical connectors is reduced or removed.

In accordance with further embodiments of the present invention, the antenna radiator elements may be formed on a first area of a first rigid circuit board that is interconnected to a plurality of additional rigid circuit board areas provided by the first rigid circuit board or by other rigid circuit boards through a common flexible circuit board. For example, a first area of the first rigid circuit board may be interconnected to a second area of the first rigid circuit board on a first side of the first rigid circuit board, and to a third area of the first rigid circuit board on a second side of the first rigid circuit board, by a flexible circuit board that is laminated to each of the areas of the first rigid circuit board. In an assembled or finished state, the first rigid circuit board is segmented. Accordingly, the second and third areas of the first rigid circuit board may be positioned at an angle to the first area of the first rigid circuit board. In addition, the second and third rigid circuit boards may be positioned such that they are substantially parallel to one another. In accordance with still other embodiments of the present invention, one or more of the areas of the first rigid circuit board may be associated with or opposite to complementary areas of a second rigid circuit board, on an opposite side of the flexible circuit board.

In accordance with embodiments of the present invention, the first area of the first rigid circuit board may comprise a portion of a unit sub-array that provides at least a first row of antenna radiator elements comprising a portion of the total number of radiator elements that may be included as part of a phased array antenna assembly. In accordance with still other embodiments of the present invention, the first rigid circuit board may comprise a portion of a unit sub-array that provides a number of rows of elements provided as part of a phased array antenna. Accordingly, a phased array antenna unit sub-array in accordance with embodiments of the present invention may provide a number of antenna elements comprising a single tile of a phased array antenna. More particularly, a number of unit sub-arrays may be interconnected to one another, for example using a mechanical housing, and covered by a radome for protection from the environment.

Other embodiments of the present invention provide methods for manufacturing phased array antennas. In accordance with such embodiments, one or more rigid circuit boards may be provided. On a first one of the circuit boards, one or more antenna elements are formed. In addition, connective traces and component pads are formed in a second area of the first rigid circuit board. The method additionally includes forming transmission lines on a first flexible circuit board. The first rigid circuit board is then laminated to the first flexible circuit board to form a first composite circuit board. After laminating the first rigid circuit board to the first flexible circuit board, material provided as part of the first rigid circuit board that is in and/or adjacent to a region between the first and second areas of the rigid circuit board is removed. The first flexible circuit board may then be folded in the region between the first and second areas of the rigid circuit boards. Accordingly, the second area of the rigid circuit board may be positioned at an angle to the first area of the rigid circuit board containing the antenna elements. Furthermore, the second area of the rigid circuit board may be located such that the entire surface of the second area falls within a projection of the first area. Accordingly, the first area does not limit the area of the second area. That is, the second area can continue in a direction generally perpendicular to the plane of the first area indefinitely.

In accordance with further embodiments of the present invention, various components can be placed or formed on the rigid and/or flexible circuit boards. For instance, in addition to transmission lines, the flexible layer may include matching networks, stubs, stripline matching circuits, splitters/combiners, direct current (DC) supply lines and through holes. As another example, the rigid circuit board, in addition to antenna elements in a first area and connective traces and component paths in a second area, may have matching networks, stubs, stripline matching circuits, splitters/combiners, DC supply lines and through holes.

In accordance with further embodiments of the present invention, prior to removing material provided as part of the rigid circuit board in or adjacent to a region between the first and second areas of the rigid circuit board, components, such as discrete electrical components can be bonded or soldered to the rigid circuit board. As a result, components may be interconnected to the rigid circuit board while the rigid circuit board and the interconnected flexible circuit board are laying flat, allowing for the use of mass production pick and place techniques to complete the circuit board, rather than a manual placement of discrete components, such as might be required if the unit sub-array were not in a flat configuration at this point in its assembly.

In accordance with still further embodiments of the present invention, the operation of the unit sub-array assembly may be tested while the unit sub-array is in a flat configuration. If defects are found, discrete components can be repaired or replaced, or other remedial action taken, relatively easily. After a number of unit sub-arrays have been assembled, they may be interconnected to one another using a housing or other structure. In addition, a number of unit sub-arrays may be electrically interconnected to control and/or feed circuitry, to provide a completed phased array antenna.

Additional features and advantages of embodiments of the present invention will become more readily apparent from the following discussion, particularly when taken together with the accompanying drawings.

BRIEF DESCRIPTION OF THE DRAWINGS

FIGS. 5A-5C are elevations of phased array antenna assembly unit sub-arrays in accordance with embodiments of the present invention;

DETAILED DESCRIPTION

The present invention provides unit sub-arrays formed from interconnecting at least a first rigid circuit board to a flexible circuit board. More particularly, the unit sub-arrays feature antenna radiator elements that are interconnected to supporting circuitry in which the area available for creation and/or placement of the supporting circuitry is not limited to an area generally defined by the area of the radiator element or the area of the radiator elements plus at least one-half of the area between and/or surrounding the radiator elements. Furthermore, embodiments of the present invention facilitate the manufacture of phased array antennas by providing unit sub-arrays that can be manufactured as flat circuit boards using conventional techniques, including automated techniques. One application for such a modular architecture is the creation of phased array antenna assemblies.

Figure 1:
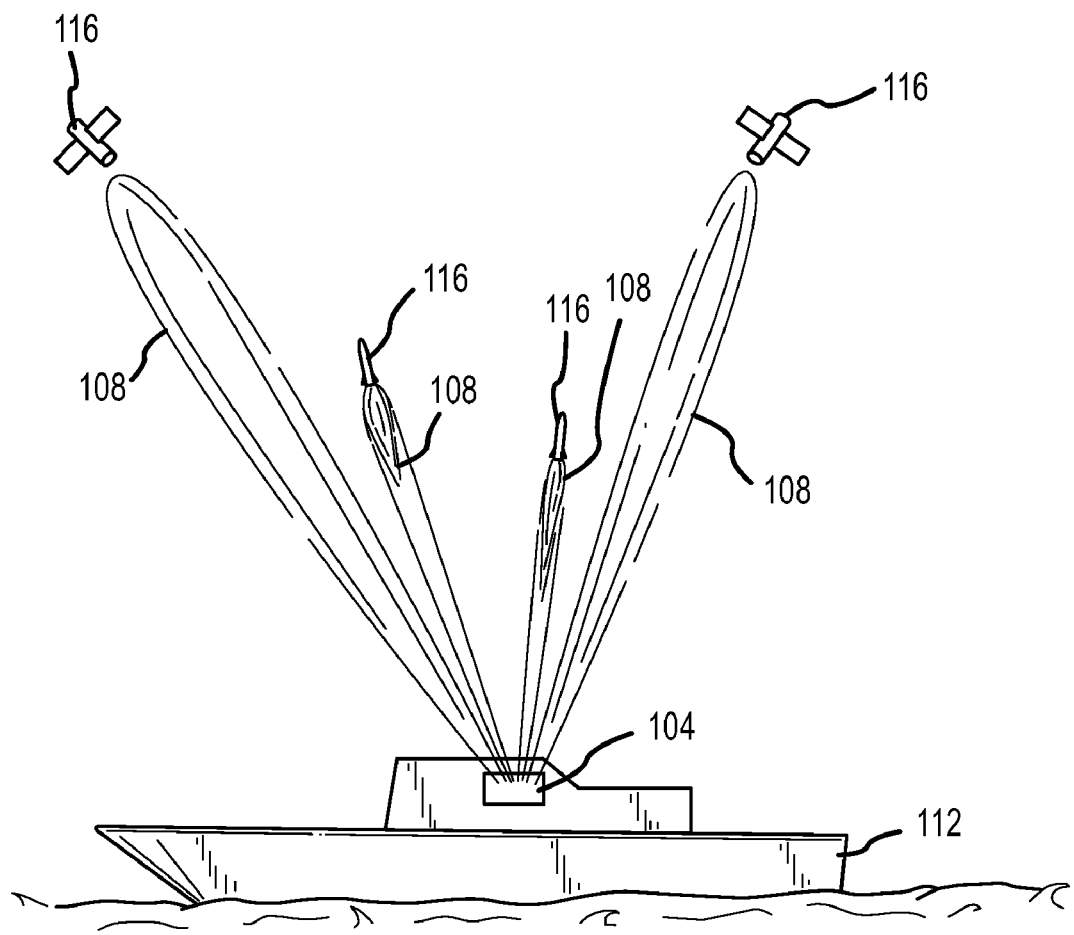
FIG. 1 depicts a multiple beam phased array antenna in an exemplary operating environment.

With reference now to FIG. 1, a phased array antenna assembly 104 capable of forming and/or receiving a number of independent beams 108 is depicted in an exemplary operating environment. In the example of FIG. 1, the beams 108 formed and/or received by the phased array antenna assembly 104 are used in connection with communications between the platform 112 with which the phased array antenna assembly 104 is associated and various communication nodes or devices 116. Although depicted as being deployed on a platform comprising a ship 112, it can be appreciated that a phased array antenna 104 capable of forming one or more antenna beams 108 can be deployed in connection with any device or location where one or more steerable signal paths or channels are desired. Furthermore, while the example communication nodes or devices 116 depicted in the figure are shown as space borne satellites or airborne platforms, a communication node or device 116 can comprise any ground, sea, air, or space based device or platform. Also, while the example system shown in FIG. 1 is described as being used for communications, such as for sending or receiving data, telemetry or control instructions, it can be appreciated that another exemplary use for a phased array antenna 104 may include radar systems for identifying and tracking platforms or objects. Furthermore, although four antenna beams 108 are depicted, a phased array antenna assembly 104 in accordance with embodiments of the present invention is not limited to any particular number of beams 108.

Figure 2:
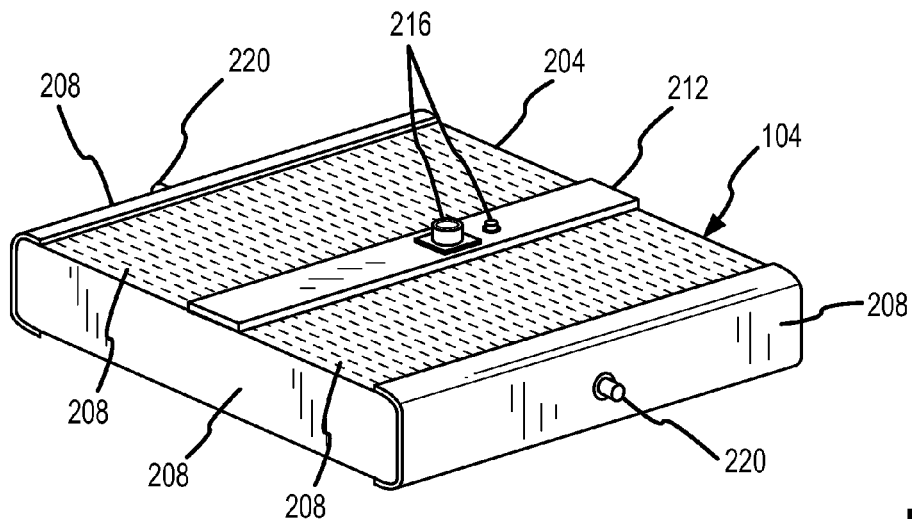
FIG. 2 depicts a phased array antenna assembly in accordance with embodiments of the present invention.

With reference to FIG. 2, a phased array antenna 104 in accordance in accordance with embodiments of the present invention is illustrated. In general, the phased array antenna 104 comprises a number of unit sub-arrays 204 held in a frame 208. In the figure, a backside (i.e., a side opposite the side proximate to which the antenna radiator elements are formed) is visible. A signal transmission board 212 electrically interconnects the unit sub-arrays 204 to control circuitry through one or more connectors 216. As shown in FIG. 2, a phased array antenna assembly 104 in accordance with embodiments of the present invention may also include ports 220 for passing a cooling medium (for example, air) over the unit sub-arrays 204 to maintain appropriate operating temperatures.

Figure 3:
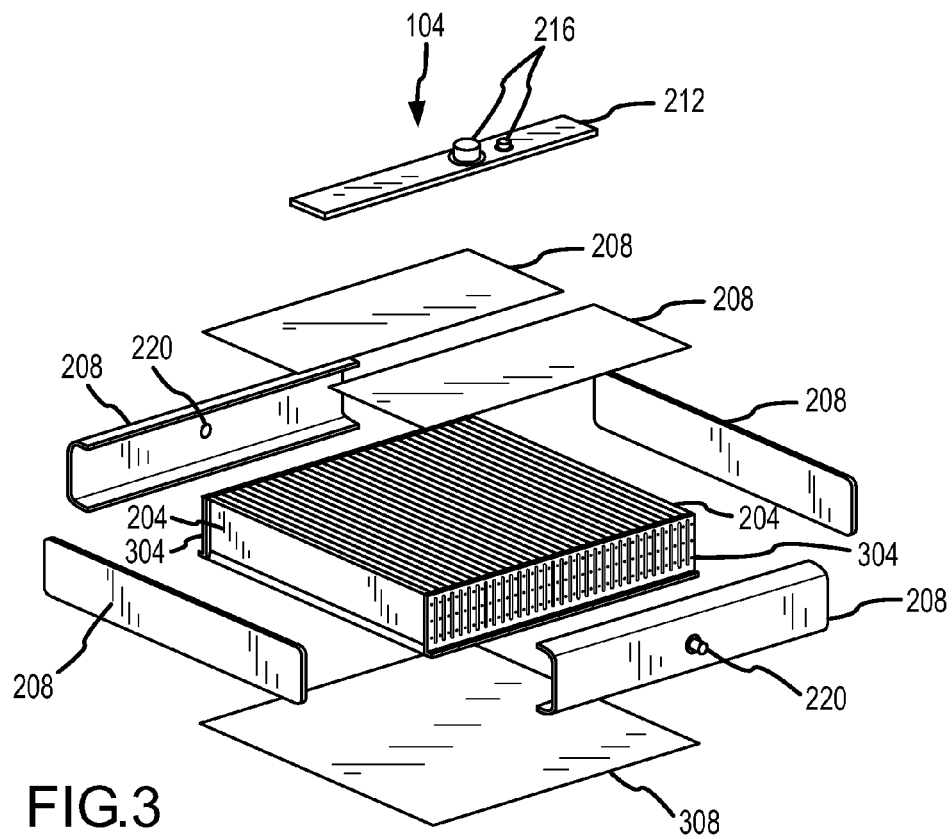
FIG. 3 is an exploded view of the phased array antenna assembly of FIG. 2.

FIG. 3 is an exploded view of the phased array antenna assembly 104 shown in FIG. 2. Visible in FIG. 3 are support members 304 to which the individual unit sub-arrays 204 are mechanically interconnected. In addition, the radome 308 is visible. The radome 308 is proximate to the radiator elements of the unit sub-arrays 204 in the assembled phased array antenna 204.

Figure 4:
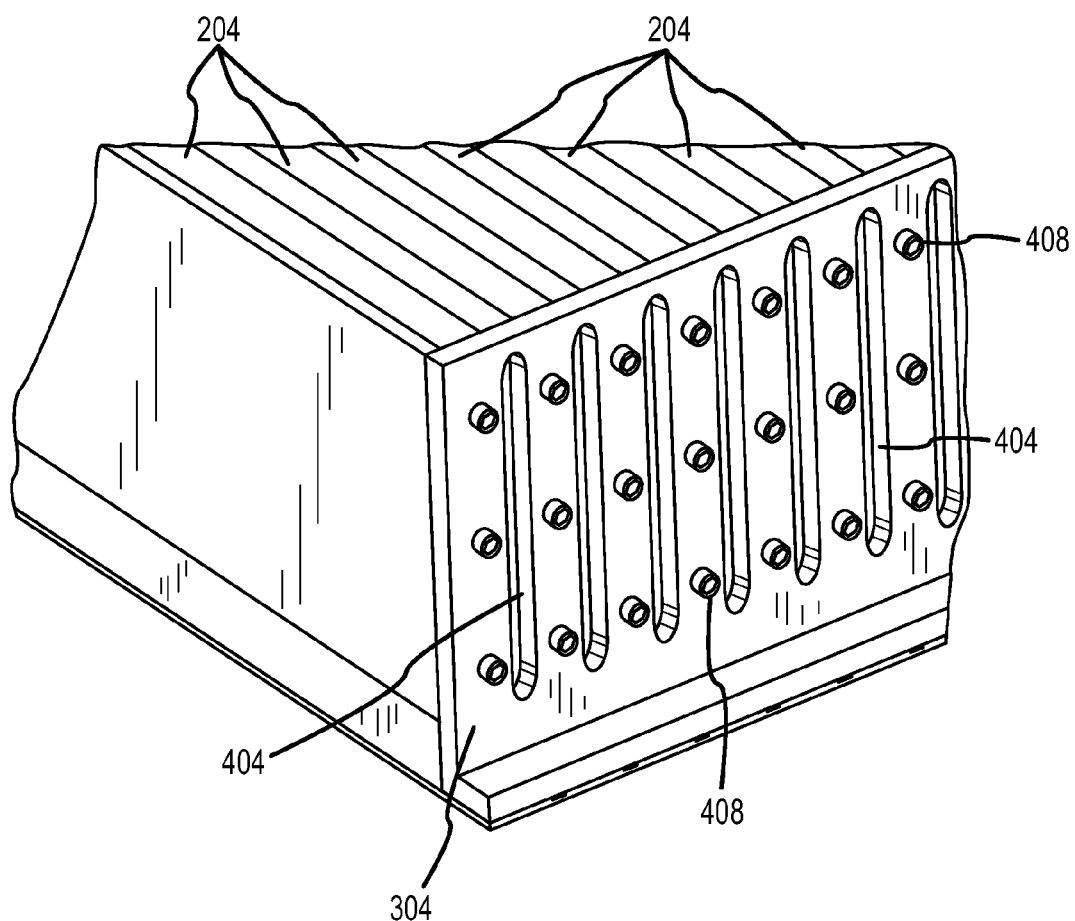
FIG. 4 is a partial view of a phased array antenna assembly frame and interconnected unit sub-arrays in accordance with embodiments of the present invention.

With reference to FIG. 4, a portion of one support member 304 and portions of interconnected unit sub-arrays 204 are shown. Slits 404 may be provided for allowing air to pass between the unit sub-arrays 204 for cooling the circuitry of the unit sub-arrays 204. In addition, fasteners 408 may be provided for interconnecting the unit sub-arrays 204 to support member 304. By providing for the mechanical interconnection of unit sub-arrays 204 to a common support member or members 304 using mechanical fasteners 408, the interconnection and removal of unit sub-arrays 204 to the frame 304 can be facilitated, thereby facilitating assembly and repair of the phased array antenna 104.

FIGS. 5A through 5C illustrate various exemplary unit sub-array 204 configurations. In addition, a number of components that may be included as part of a unit sub-array 204 are illustrated. These components include a first flexible circuit board 504. In addition, these components may include a first or primary rigid board 508 that has been segmented into a number of areas. As illustrated, a second or auxiliary rigid circuit board 520 may also be included. Furthermore, areas of first 508 and second 520 circuit boards may be arranged on opposite sides of the flexible circuit board 504 such that they are complementary to one another. Together, the flexible circuit board 504 and any interconnected rigid circuit boards 508, 520 comprise a composite circuit board 510. At least a first area 508a of the first rigid circuit board 508 has formed thereon one or more antenna radiator elements 512.

More particularly, FIG. 5A illustrates in elevation an exemplary unit sub-array 204a in which the first rigid circuit board 508 has been segmented into a first area 508a containing or having formed thereon a number of antenna radiator elements 512 and a second area 508b. The flexible circuit board 504 is folded or bent in a first region 516 between the first 508a and second 508b areas of the first rigid circuit board 508. In addition, the unit sub-array 204 in this example includes a second rigid circuit board 520 that it is segmented into a first area 520a and a second area 520b.

Figure 6A:
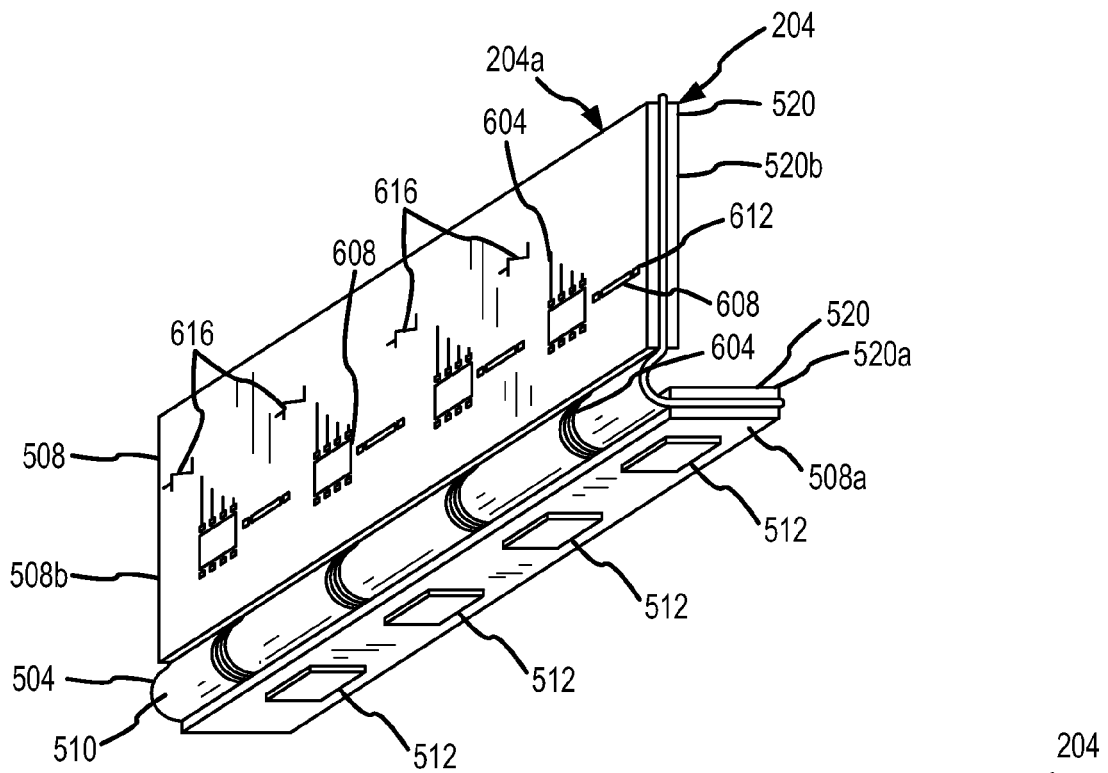
FIGS. 6A-6C are perspective views of the phased array antenna assembly unit sub-arrays of FIGS. 5A-5C.

FIG. 6A is a perspective view of the unit sub-array 204a of FIG. 5A. In FIG. 6A, it can be seen that the unit sub-array 204a of this example features a single row of antenna radiator elements 512. As shown, connective traces or transmission lines 604 formed on or as part of the flexible circuit board 504 are visible. The flexible circuit board 504 may also include additional features, such as matching networks, stubs, stripline matching circuits, splitters/combiners and DC bias lines. However, a flexible circuit board 504 will typically feature only transmission lines 604 and DC lines in the regions (e.g. regions 516, 518) where the flexible circuit board 504 is bent or folded. Discrete electrical components 608 interconnected to the second area 508b of the first rigid circuit board 508 are also visible. As illustrated, the discrete components 608 may be interconnected to or formed on the first rigid circuit board 508 at component pads 612. The first rigid circuit board 508 may additionally include connective traces 604. Other features that may be formed on or as part of the first rigid circuit board 508 include matching circuits and stubs 616 or other circuit elements, such as transmission lines, matching circuits, hybrid circuits, splitters/combiners, DC bias lines, component pads, etc. The second rigid circuit board 520 may also have discrete components 608 that are interconnected to or formed on the second rigid circuit board 520, connecting traces 604 or other circuit elements or features. In general, discrete components 608, component pads 612, matching circuits and stubs 616 or any other circuit elements can be formed in any area (e.g., 508a-c and 520 a-c) of any rigid circuit board provided as part of a unit sub-array 204. In addition, antenna radiator elements 512 can be included on any area of any rigid circuit board 508, 520.

In FIG. 5B, another exemplary unit sub-array 204b in accordance with other embodiments of the present invention is illustrated. The unit sub-array 204b features a first rigid circuit board 508 that is segmented into first 508a, second 508b and third 508c areas. In addition, the example unit sub-array 204b includes two rows of antenna radiator elements 512 formed on the segment of the first rigid circuit board 508 comprising the first area 508a.

The unit sub-array 204b has a flexible circuit board 504 that is folded in or along a first region 516 between the first 508a, and second 508b areas of the first rigid circuit board. In addition, the flexible circuit board 504 is folded in a second region 518 between the first 508a and third 508c areas of the first rigid circuit board 508. The example unit sub-array 204b also includes a second rigid circuit board 520 that is segmented into first 520a, second 520b and third 520c areas.

Figure 6B:
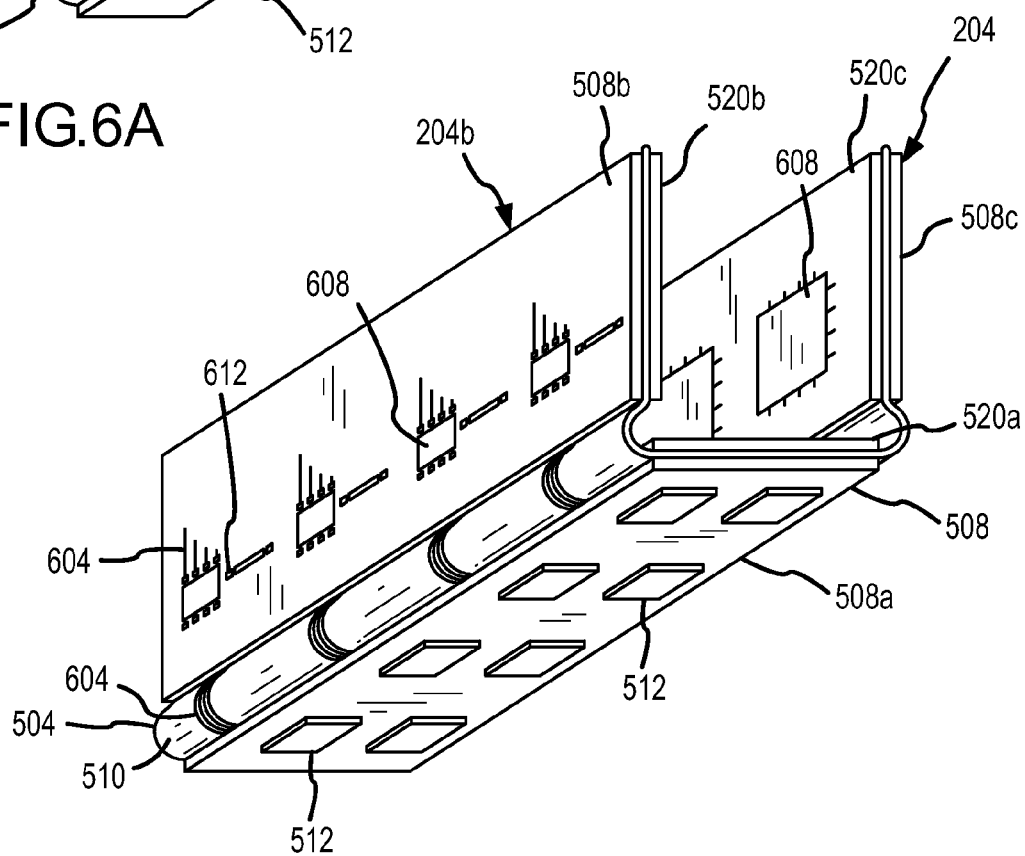

FIG. 6B is a perspective view of the unit sub-array 204b shown in elevation in FIG. 5B. As seen in FIG. 6B, the first rigid circuit board 508 can have formed thereon rows of antenna elements 512 that each comprise a plurality of antenna radiator elements 512. Discrete components 608 are shown interconnected to or formed on the first 508 and second 520 rigid circuit boards. Also, the flexible circuit boards 504 and rigid circuit boards 508, 520 may include connective traces 604 and/or other circuit elements or features.

Figure 6C:
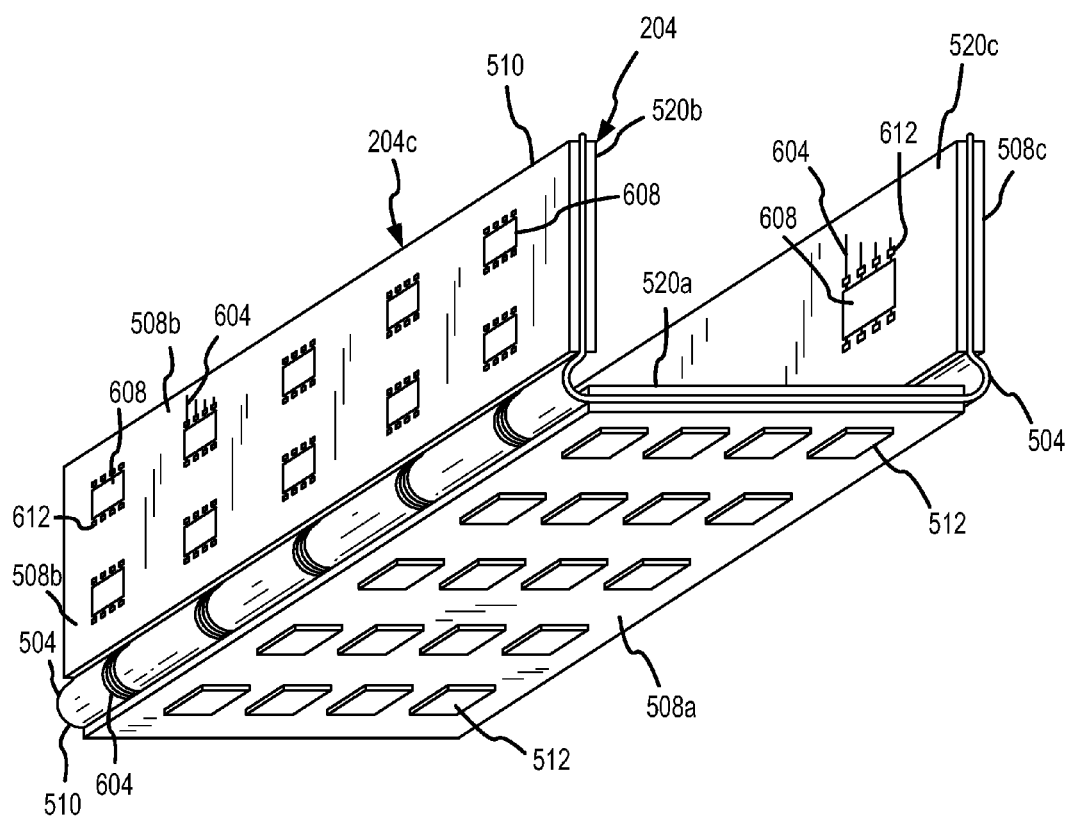

With reference to FIG. 5C, another exemplary unit sub-array 204c in accordance with embodiments of the present invention is depicted. The unit sub-array 204c includes four rows of antenna radiator elements 512 formed in a first area 508a of the first rigid circuit board 508. The first rigid circuit board 508 additionally includes a second area 508b and a third area 508c. The second 508b and third 508c areas provide additional circuit board surface for the formation and attachment of additional electronic components 608. The example unit sub-array 204 also includes a second rigid circuit board that is segmented into first 520a, second 520b and third 520c areas. A perspective view of the exemplary unit sub-array 204c is shown in FIG. 6C.

Figure 7:
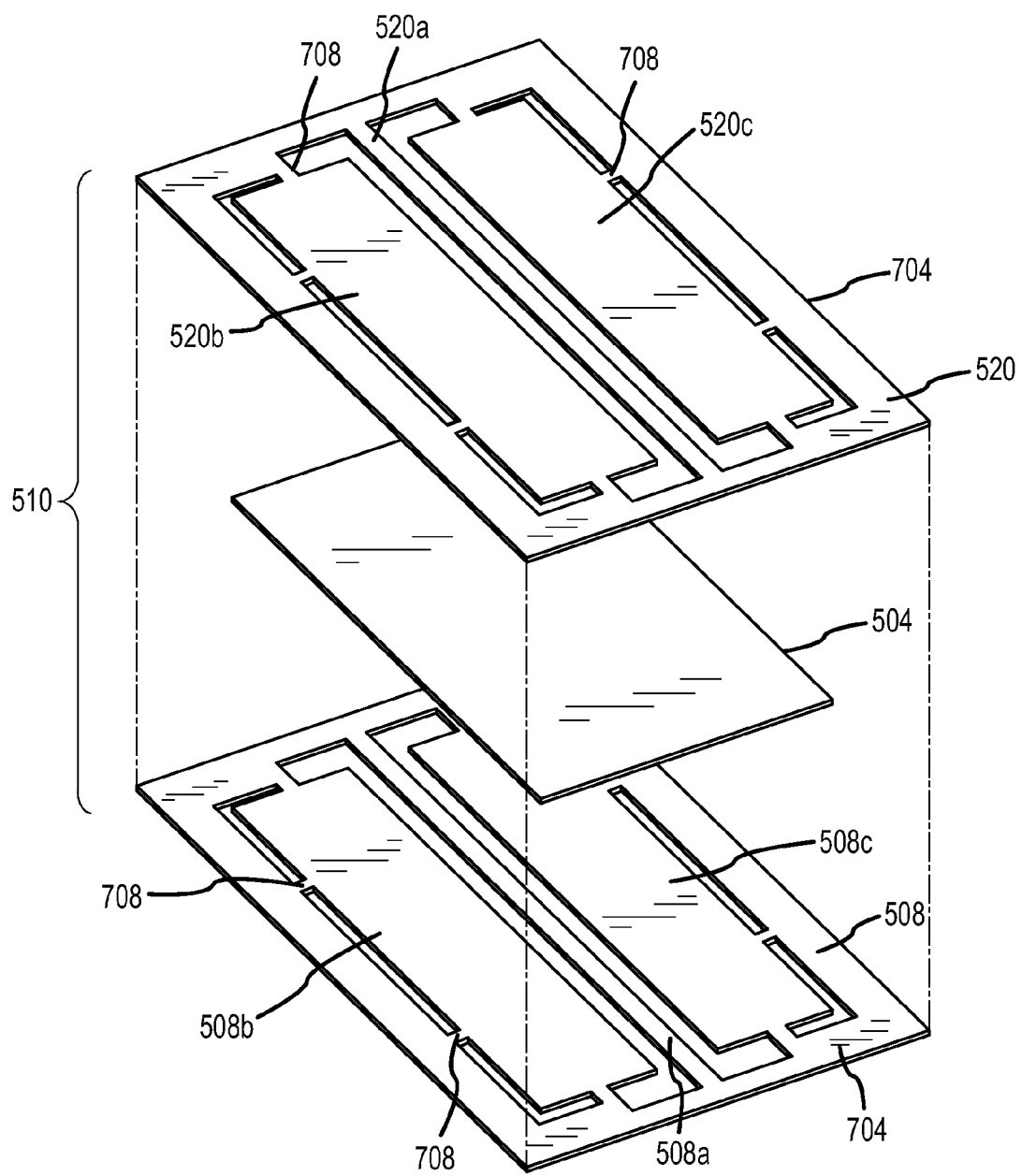
FIG. 7 is an exploded view of rigid and flexible circuit boards prior to lamination in accordance with embodiments of the present invention.

FIG. 7 is a perspective view of a composite circuit board 510 prior to lamination of the individual circuit board components 504, 508 and/or 520 to one another to form the composite circuit board 510. The example composite circuit board 510 illustrated in FIG. 7 includes a first rigid circuit board 508, a first flexible circuit board 504 and a second rigid circuit board 520. As seen in FIG. 7, the first rigid circuit board 508 of the example composite circuit board 510 includes a first area 508a, a second area 508b and a third area 508c. Likewise, the second rigid circuit board 520 includes a first area 520a, a second area 520b, and a third area 520c. The flexible circuit board 504 has an area that extends across all of the first, second and third areas of the first 508, and second 520 rigid circuit boards. In addition, the first rigid circuit board 508 includes open areas or regions between the first area 508a and each of the second 508b and third 508c areas. The different areas 508a-508c of the first rigid circuit board 508 are interconnected to one another by a surrounding frame 704 and tabs 708. The second rigid circuit board 520 also includes spaces in areas or regions between the first area 520a and each of the second 520b and third 520c areas. The different areas 520a-520c of the second rigid circuit board are held together by a frame 704 and interconnecting tabs 708.

Figure 8:
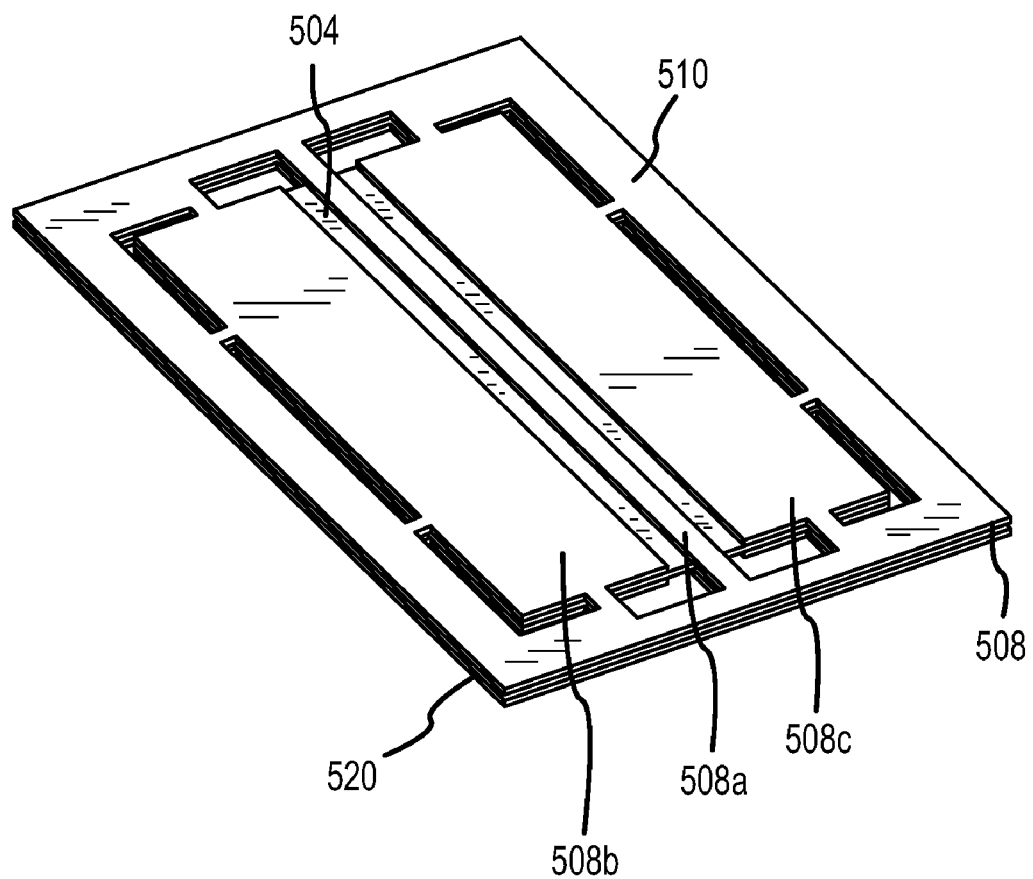
FIG. 8 is a perspective view of rigid and flexible circuit boards after lamination to form a composite circuit board in accordance with embodiments of the present invention.

With reference to FIG. 8, a composite circuit board 510 after lamination of the individual board components is illustrated. More particularly, FIG. 8 illustrates a composite circuit board 510 after lamination of the component circuit boards 504, 508, 520, but prior to machining away areas of the circuit boards 504, 508, and/or 520 that will not be included in the completed unit sub-array 204.

Figure 9:
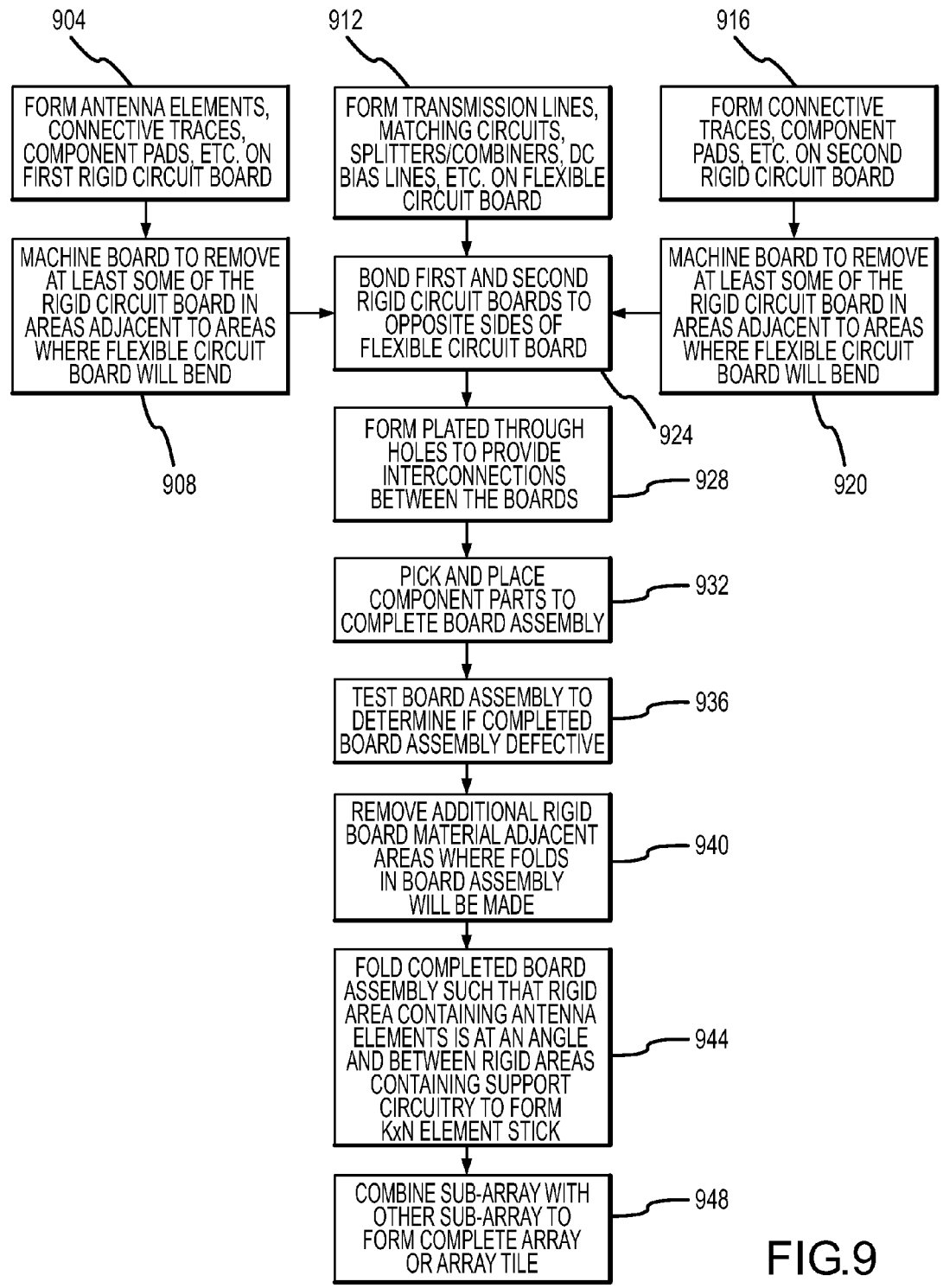
FIG. 9 is a flow chart depicting aspects of the creation of a phased array antenna assembly using unit sub-arrays in accordance with embodiments of the present invention.

With reference now to FIG. 9, a flow diagram illustrating a method for producing a unit sub-array 204 that may be included in a phased array antenna 104 in accordance with the embodiments of the present invention is shown. At step 904, antenna elements 512, connective traces 604, component pads 612 and any other interconnections or features that may be formed from a multilayer rigid circuit board are formed on the first rigid circuit board 508. As can be appreciated by one skilled in the art after consideration of the present disclosure, the first rigid circuit board 508 may comprise a set of rigid circuit boards bonded or laminated to one another to provide a number of conductive layers that are available for the formation of features and/or interconnections. Accordingly, formation of the first rigid circuit board 508 may include printing, etching, milling or otherwise forming features of at least the individual interior layers, and joining these layers together. In addition, conductive layers of the first rigid circuit board 508 may be interconnected to one another, for example by vias or plated through holes. Examples of suitable rigid circuit board 508 or 520 material include fiberglass reinforced materials, such as FR-4, Rogers 4000® series materials, or other materials. In general, the antenna elements 512 are formed within a first area 508a of the first rigid circuit board. Components pads are generally formed in the second area 508b and (if provided) the third area 508c of the first rigid circuit board. Other features such as connective traces, stubs, etc., can be formed in any area of the first rigid circuit board 508. The first rigid circuit board 508 may then be machined to remove some of the circuit board material in areas or regions that would otherwise overlay or correspond to regions of the flexible circuit board 504 that will be bent or folded when the unit sub-array 204 is configured for inclusion in a phased array antenna 104 (step 908).

At step 912, which may (but need not) be performed concurrently with steps 904 and 908, transmission lines, matching circuits, hybrid circuits, splitters/combiners, DC bias lines, etc., may be formed on the flexible circuit board 504. The flexible circuit board 504 may comprise multiple conductive layers. Accordingly, forming the flexible circuit board 504 may comprise printing, etching, milling or otherwise forming features of at least the individual interior layers, and joining those layers together. These conductive layers may be interconnected to one another, for example by vias or plated through holes. Examples of suitable flexible circuit board 504 material include liquid crystal polymer (LCP), Capton® or other materials.

At step 916, which also may (but need not) be performed concurrently with steps 904, 908 and 912, connective traces, component pads, vias, plated through holes, etc., are formed on the second rigid circuit board 520 (if provided). As can be appreciated by one skilled in the art after consideration of the present disclosure, the second rigid circuit board 520 may comprise a number of bonded or laminated rigid circuit boards, to provide multiple layers of conductive material. At step 920, the second rigid circuit board 520 may be machined to removed at least some of the rigid circuit board material in areas or regions that will be adjacent to areas of the flexible circuit board 504 that will be bent or folded when the unit sub-array 204 is configured for inclusion in a phased array antenna 104.

At step 924, the first 508 and second 520 rigid circuit boards are joined (e.g., bonded) to opposite sides of the flexible circuit board 504, to form a composite circuit board 510. At step 928, plated through holes are formed to provide interconnections between the boards 504, 508, and/or 520. Also, the outer sides of the circuit boards 508, 520 can be printed, etched, milled, etc., after formation of the composite circuit board 510, if this was not done in an earlier step or steps. At step 932, discrete components may be picked and placed on the composite circuit board 510 while the composite circuit board 510 is flat (ie., prior to bending or folding the composite circuit board 510). Accordingly, common mass production techniques can be used for interconnecting, discrete components to the planer composite circuit board 510. After interconnecting discrete components to the composite circuit board 510, but while the composite circuit board is still in a planer configuration, the composite circuit board assembly can be tested to determine if it is defective (step 936). If defects are found, repair or replacement of defective components or features may be performed.

After completion of the composite circuit board assembly, and after remedying any problems found during testing, additional rigid circuit board 508, 520 material may be removed to allow the completed circuit board assembly comprising a unit sub-array 204 to be folded (step 940). Removing the additional circuit board 508, 520 material may comprise removing the portion or portions of the rigid circuit boards 508, 520 comprising a frame 704 and/or tabs 708. The completed board assembly may then be folded such that the first area 508a of the first rigid circuit board 508 is at an angle to the second area 508b containing support circuitry to place the unit sub-array 204 in the configuration that will be needed in order to incorporate the unit sub-array 204 into the remainder of the phased array antenna 104 (step 944). Where the unit sub-array 204 features a rigid circuit board 508 that is segmented into three areas 508a-c, the completed circuit board assembly is folded such that the plane of the first area 508a containing the antenna elements 512 is at an angle (e.g., 90°) to the planes of the second 508b and third 508c areas containing support circuitry. As can be appreciated by one of skill in the art after consideration of the present disclosure, where the unit sub-array 204 also includes a second rigid circuit board 520, the regions of the first circuit board 508 are generally adjacent to corresponding regions of the second rigid circuit board 520, but are separated from those corresponding regions by the flexible circuit board 512. The unit sub-array 204 is then combined with the other unit sub-arrays 204 to complete the phase array antenna 104 (step 948).

Figure 10:
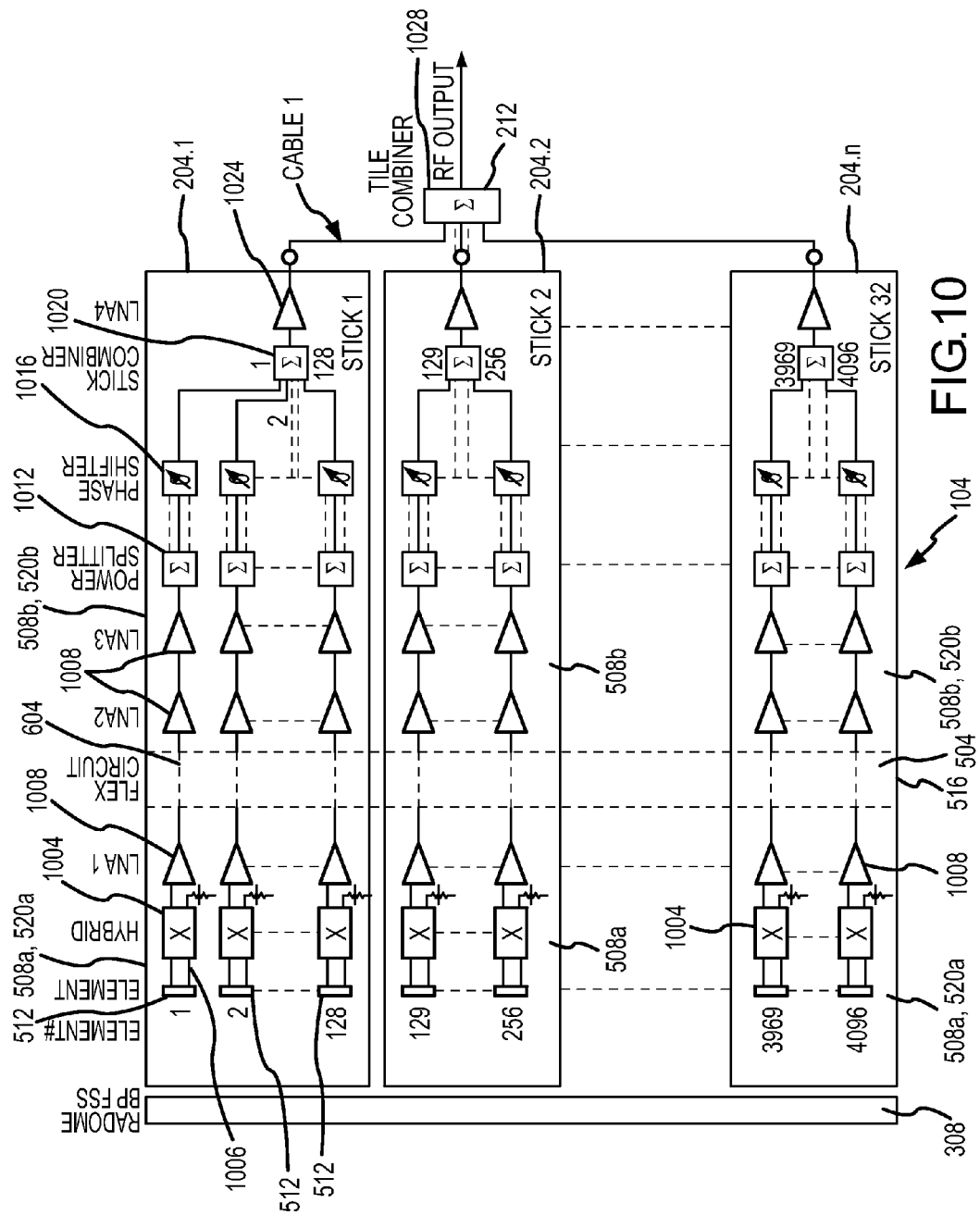
FIG. 10 is a schematic depiction of circuit elements provided as part of a phased array antenna assembly in accordance with embodiments of the present invention.

With reference to FIG. 10, components that may be included as part of a phased array antenna 104 are depicted schematically. These components may include a radome 308. The radome 308 may provide environmental protection for other components of the phased array antenna 104. In addition, the radome 308 may provide a surface that conforms to other surfaces of the platform 112 with which the phased array antenna assembly 104 is associated. In accordance with other embodiments of the present invention, the radome 308 may comprise a bandpass filter, frequency selective surface or other passive or active radio frequency filter or component.

The example phased array antenna assembly 104 depicted in FIG. 10 includes a plurality of unit sub-arrays 204. Although three unit sub-arrays 204.1, 204.2, and 204.n, are depicted, it should be appreciated that the number of unit sub-arrays 204 that may be included in a phased array antenna assembly 104 is not limited to any particular number. Each of the unit sub-arrays 204 provides a number of antenna radiator elements 512. In the particular example of FIG. 10, each of the unit sub-arrays 204 provides 128 radiator elements 512. However, the number of radiator elements 512 that are provided by each unit sub-array 204 is not limited to any particular number. Furthermore, although certain advantages may be realized by providing a plurality of unit sub-arrays 204 that each have the same number of antenna radiator elements 512, for example to promote modular aspects of the phased array antenna assembly 104, other embodiments may provide unit sub-arrays 204 that do not all have the same number of antenna radiator elements 512. The antenna radiator elements 512 may be arranged in different configurations. For example, unit sub-arrays 204 that include 128 antenna radiator elements 512 may arrange those radiator elements 512 along the surface of a first area 508a of the first rigid circuit board 508 in four rows of 32 antenna radiator elements 512 each.

Each radiator element 512 may be interconnected to a hybrid circuit 1004 by one or more transmission lines 1006. For example, each antenna radiator element 512 may be interconnected to a hybrid circuit 1004 by two transmission lines 1006, where the antenna radiator element 512 is capable of transmitting or receiving circularly polarized signals. As can be appreciated by one of skill in the art, a hybrid circuit 1004 may generally provide an interconnection between different portions of a circuit. In the example of FIG. 10, each hybrid 1004 is interconnected to at least one low-noise amplifier 1008. Furthermore, each polarization signal output by a hybrid 1004 is provided to a low-noise amplifier 1008. As can be appreciated by one of skill in the art, although certain aspects of the phased array antenna assembly 104 depicted in FIG. 10 are described in connection with the receipt of one or more beams 108, it should be appreciated that a phased array antenna assembly 104 is typically also (or alternatively) capable of forming and transmitting one or more beams 108. In order to simplify the drawing, FIG. 10 depicts components for only one polarization signal; an identical set of components may be provided for the other polarization signal. As can be appreciated by one of skill in the art after consideration of the present disclosure, the antenna radiator elements 512 are formed in the first area 508a of the first rigid circuit board 508. Additional components, such as transmission lines 512, hybrids 1004, and amplifiers 1008 can be formed on either or both the first area 508a of the first rigid circuit board 508 or the first area 520a of the second rigid circuit board 520 (if provided).

Transmission lines 604 formed on or as part of the flexible circuit board 516 carry signals between the first area 508a and/or 520a of the first 508 and/or second 520 rigid circuit boards to components 608 placed or formed on or as part of the second area 508b and/or 520b of the first 508 or second 520 rigid circuit boards. Such components 608 may include additional low-noise amplifiers 1008. In addition, such components may include a power splitter for each signal line associated with an antenna radiator element 512. In general, a power splitter 1012 divides the signal from a radiator element 512 into a number of signal paths. This number of signal paths generally equals the number of independent beams supported by the phased array antenna assembly 104. Each of the individual signal pads from a power splitter 1012 is then passed to a phase shifter 1016. As can be appreciated by one of skill in the art, by applying a selected phase shift to an individual channel, a beam associated with that channel can be steered. The phase shifted signals associated with the different channels are then combined in a combiner 1020. That is, a combiner 1020 is provided for each of the beams or channels supported by the phased array antenna 104. The output from each combiner may then be provided to an amplifier 1024.

The output comprising an individual beam from a combiner 1020 may be passed along a transmission line provided at least in part by the radio frequency combining board 212. The radio frequency combining board 212 may additionally provide or comprise a combiner 1028 to combine the different beam signals from the different unit sub-arrays 204, prior to passing the beam signals to central processing circuitry via connectors 216.

As can be appreciated by one of skill in the art after consideration of the present disclosure, a unit sub-array 204 providing 128 antenna radiator elements 512 will therefore include 128 power splitters 1012 for each supported polarization output. Accordingly, in the present example, where the phased array antenna assembly 1004 supports circularly polarized signals, 256 power splitters 1012 will be provided as part of each unit sub-array 204. In an exemplary phased array antenna assembly 104 that supports four independent beams 108, four phase shifters 1016 are associated with each power splitter 1012. Accordingly, a unit sub-array 204 that provides 128 antenna radiator assemblies 512 and support for four independent, circularly polarized beams 108, may include 1024 phase shifters 1016. The output for each phase shifter 1016 is provided to a selected combiner 1020 according to the individual beam 108 supported by a particular shifter 1016. Therefore, continuing the present example, a unit sub-array 204 supporting for circularly polarized antenna beams 108 would include eight combiners 1020 (four combiners 1020 for each polarization).

Accordingly, it can be appreciated that a very large number of components must be included in and/or formed on circuit boards 504, 508, and/or 520 provided as a unit sub-array 204 comprising a tile or a module of a phased array antenna assembly 104. However, because the flexible circuit board 504 allows areas (eg., second and/or third areas 508b, 520b, 508c, 520c) of rigid circuit boards providing supporting circuitry to lie in planes that are at an angle to the plane defined but the first area, the circuit board area available for such supporting components are not limited to the area taken up by the included radiator elements 512. Furthermore, this allows relatively inexpensive components to be used. For example, instead of using monolithic microwave integrated circuits (MMICs), discrete and/or silicon-based components may be used instead. In addition, the cost of manufacturing the completed phased array antenna assembly 104 can be reduced by using unit sub-arrays 204 as disclosed herein, because the unit sub-arrays 204 can be manufactured using conventional, mass production pick and place techniques while the unit sub-array 204 is in a flat configuration. Manufacturing costs can further be reduced by allowing the unit sub-arrays 204 to be tested in the flat configuration, because replacement and/or repair of components or features of the unit sub-array 204 is therefore facilitated.

As can also be appreciated by one of skill in the art, although certain examples provided herein have described the operation of a phased array antenna 104 in one of sending or receiving radio frequency beams, a phased array antenna will typically be capable of operation in both transmit and receive modes. Furthermore, where one such mode is described, it can be appreciated that the operation and/or signal flows for performing the other mode is generally the opposite of the described mode. For instance, a component operating as a power splitter 1012 in a receive mode of a unit sub-array 204 of a phased array antenna 104 operates as a combiner in a transmission mode. Likewise, a component operating as a combiner 1020 in a receive mode operates as a power splitter in a transmission mode.

Figure 11:
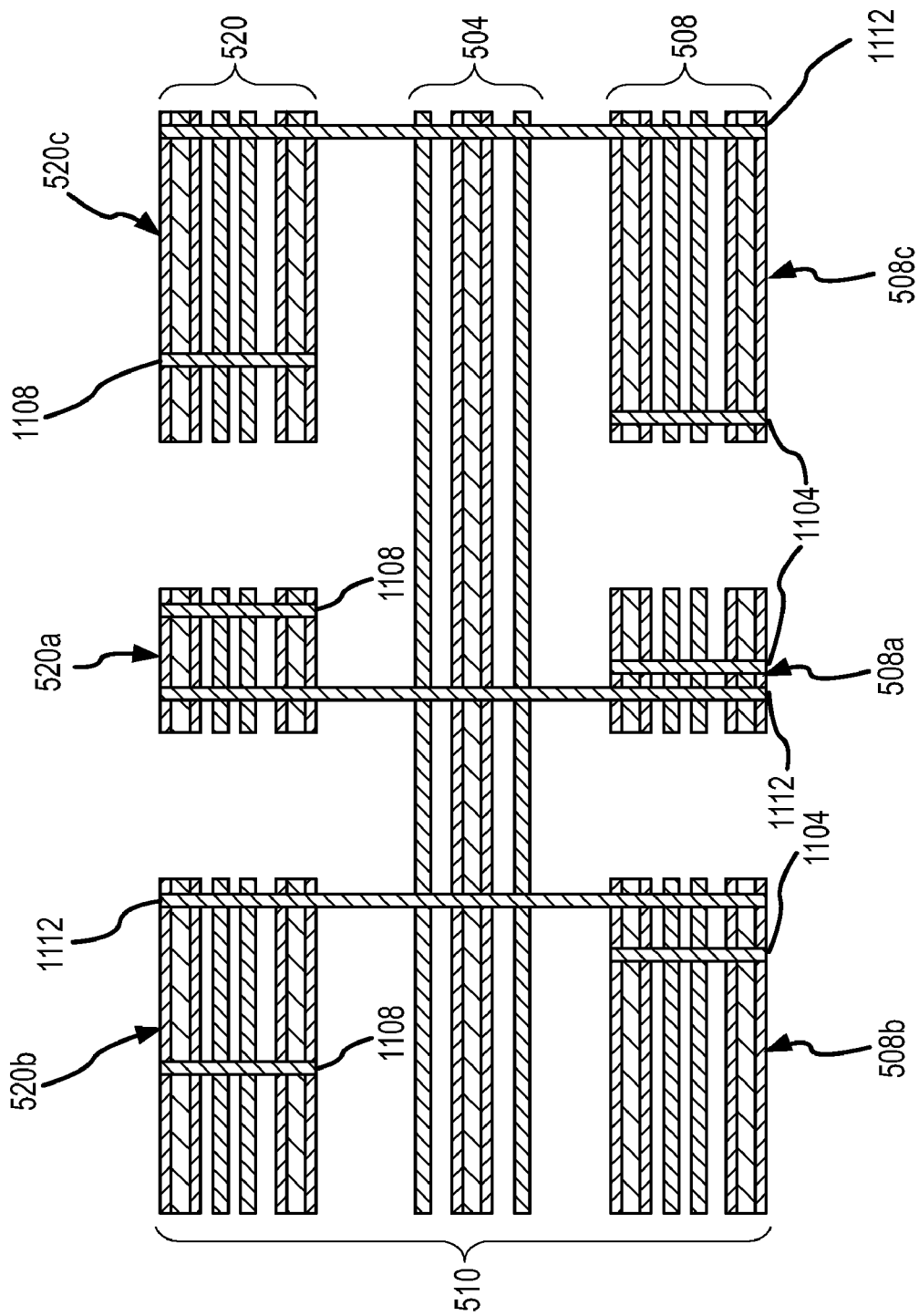
FIG. 11 is a depiction of a cross section of a portion of a composite circuit board in accordance with embodiments of the present invention.

With reference to FIG. 11, a cross section of the composite circuit board 510 in accordance with embodiments of the present invention is illustrated. In particular, it can be seen that the rigid circuit boards 508, 520 and the flexible circuit board 504 are each formed from a number of layers. The various layers of the circuit board 504, 508, and 520 can have features formed therein using conventional circuit board manufacturing techniques. For example, antenna radiator elements, strip lines, hybrids, ground planes, pads for surface mount components, etc., can be formed using chemical etching, printing and/or machining techniques. As can also be appreciated by one of skill in the art, each of the circuit boards 504, 508, and 520 can include multiple layers on which circuit features are formed. As part of the formation of the circuit boards 504, 508, and 520, through holes or vias may be drilled and/or plated. For example, a first set of drill holes 1104 can be drilled and plated during formation of the first rigid circuit board 508. Similarly, a second set of drill holes 1108 can be formed and plated as part of the formation of the second rigid circuit board 520. Drill holes can also be formed and plated as part of the formation of the flexible circuit board 504. In addition, after laminating the first rigid circuit board 508 and the second 520 rigid circuit board to opposite sides of the flexible circuit board 504, drill holes 1112 may be formed and plated. Also, prior to lamination of the circuit boards 504, 508, 520 to one another, portions of the first and second rigid circuit boards 508, 520 corresponding to and/or adjacent the first 516 and second 518 regions where the flexible circuit board 516 will be bent or folded are machined away. However, because a supporting structure, for example in the form of a frame 704 and tabs 708 is in place at this point, the entire circuit board 508 and 520 is fixed in a planar configuration at the time the rigid circuit boards 508, 520 are laminated to the flexible circuit board 504.

Although various embodiments of the present inventions, have described particular examples that include first 508 and second 520 rigid circuit boards, it should be appreciated that the present invention is not limited to such embodiments. For instance, a single rigid circuit board 508 can be used in combination with a flexible circuit board 516 to form unit sub-arrays 204 as described herein. In addition, although embodiments of unit sub-arrays 204 having second or third areas for supporting circuitry have been discussed, other areas for supporting circuitry, such as the first area 520a of a second rigid circuit board 520, can have supporting circuitry. Also, additional circuit board areas (e.g. fourth and fifth) for supporting circuitry can be provided. Furthermore, additional areas may be interconnected to other areas by regions in which rigid circuit board 508 and/or 520 material has been removed, leaving only flexible circuit board material, which can be bent or folded. Additional circuit board areas may be arranged in various configurations, and such that they are at various angles to one another. For instance, a composite circuit board may be folded 180° such that adjacent rigid circuit board areas are parallel to one another.

The foregoing discussion of the invention has been presented for purposes of illustration and description. Further, the description is not intended to limit the invention to the form disclosed herein. Consequently, variations and modifications commensurate with the above teachings, within the skill or knowledge of the relevant art, are within the scope of the present invention. The embodiments described hereinabove are further intended to explain the best mode presently known of practicing the invention and to enable others skilled in the art to utilize the invention in such or in other embodiments and with the various modifications required by their particular application or use of the invention. It is intended that the appended claims be construed to include alternative embodiments to the extent permitted by the prior art.

What is claimed is:

1. A method for forming an antenna, comprising:
   forming antenna elements in a first area of a first rigid circuit board;
   forming connective traces and component pads in a second area of the first rigid circuit board, wherein during forming of the antenna elements and during formation of the connective traces a first surface of the first area of the first rigid circuit board defines a plane that is substantially parallel to a plane defined by a first surface of the second area of the first rigid circuit board;
   forming transmission lines on a first flexible circuit board;
   laminating the first rigid circuit board to the first flexible circuit board to form a first composite circuit board;
   after laminating the first rigid circuit board to the first flexible circuit board, removing material provided as part of the first rigid circuit board in a first region of the first rigid circuit board between the first area of the first rigid circuit board and the second area of the first rigid circuit board;
   folding the first flexible circuit board in a region adjacent the first region of the first rigid circuit board where material was removed, wherein following folding the first flexible circuit board the first surface of the first area of the first rigid circuit board defines a plane that is at an angle to the first surface of the second area of the first rigid circuit board.

2. The method of claim 1, further comprising:
   after laminating the first rigid circuit board to the first flexible circuit board and before folding the first flexible circuit board, testing electronic performance parameters of the first composite circuit board.

3. The method of claim 2, further comprising:
   after folding the first flexible circuit board, using said first composite circuit board to at least one of transmit and receive radio frequency signals.

4. The method of claim 1, further comprising:
   before folding the first flexible circuit board, attaching at least a first discrete electrical component device to at least some of said component pads formed in said second area of said first rigid circuit board.

5. The method of claim 1, wherein the first flexible circuit board has an area that is about equal to the area of the first rigid circuit board.

6. A method for forming an antenna, comprising:
   forming antenna elements in a first area of a first rigid circuit board;
   forming connective traces and component pads in a second area of the first rigid circuit board, wherein during forming of the antenna elements and during formation of the connective traces a first surface of the first area of the first rigid circuit board defines a plane that is substantially parallel to a plane defined by a first surface of the second area of the first rigid circuit board;
   forming transmission lines on a first flexible circuit board;
   laminating the first rigid circuit board to the first flexible circuit board to form a first composite circuit board;
   after laminating the first rigid circuit board to the first flexible circuit board, removing material provided as part of the first rigid circuit board in a first region of the first rigid circuit board between the first area of the first rigid circuit board and the second area of the first rigid circuit board;
   folding the first flexible circuit board in a region adjacent the first region of the first rigid circuit board where material was removed, wherein following folding the first flexible circuit board the first surface of the first area of the first rigid circuit board defines a plane that is at an angle to the first surface of the second area of the first rigid circuit board;
   forming connective traces and component pads in a third area of the first rigid circuit board, wherein the first area of said first rigid circuit board is generally between the second and third areas of the first rigid circuit board, and wherein a first surface of the third area of the first rigid circuit board defines a plane that is generally parallel to the plane defined by the first surface of the second area of the first rigid circuit board;
   after laminating the first rigid circuit board to the first flexible circuit board to form said first composite circuit board, removing material provided as part of the first rigid circuit board in a second region of the first rigid circuit board between the first area of the rigid circuit board and the third area of the first rigid circuit board;
   folding the first flexible circuit board in a region adjacent the second region of the first rigid circuit board where material was removed, wherein following folding the first flexible circuit board the first surface of the first area of the first rigid circuit board defines a plane that is at an angle to the first surface of the third area of the first rigid circuit board.

7. The method of claim 6, wherein following folding the first flexible circuit board in the region adjacent the first region of the first rigid circuit board and following folding the first flexible circuit board in the region adjacent the second region of the first rigid circuit board the first surface of the second area and the first surface of the third area of the first rigid circuit board define planes that are substantially parallel to one another.

8. The method of claim 6, further comprising:
forming antenna elements in a first area of a second rigid circuit board;
forming connective traces and component pads in a second area of the second rigid circuit board and in a third area of the second rigid circuit board, wherein during forming of the antenna elements and during formation of the connective traces a first surface of the first area of the second rigid circuit board defines a plane that is substantially parallel to a plane defined by a first surface of the second area of the second rigid circuit board and to a plane defined by a first surface of the third area of the second rigid circuit board;
forming transmission lines on a second flexible circuit board;
laminating the second rigid circuit board to the second flexible circuit board to form a second composite circuit board;
after laminating the second rigid circuit board to the second flexible circuit board,
removing material provided as part of the second rigid circuit board in a first region of the second rigid circuit board between the first area of the second rigid circuit board and the second area of the second rigid circuit board; and
removing material provided as part of the second rigid circuit board in a second region of the second rigid circuit board between the first area of the second rigid circuit board and the third area of the second rigid circuit board;
folding the second flexible circuit board in a region adjacent the first region of the second rigid circuit board where material was removed, wherein following folding the second flexible circuit board the first surface of the first area of the second rigid circuit board defines a plane that is at an angle to the first surface of the second area of the second rigid circuit board;
folding the second flexible circuit board in a region adjacent the second region of the second rigid circuit board where material was removed, wherein following folding the second flexible circuit board the first surface of the third area of the second rigid circuit board defines a plane that is at an angle to the first surface of the second area of the second rigid circuit board;
interconnecting the folded first composite circuit board to the folded second composite circuit board, wherein the antenna elements formed as part of the first composite circuit board comprise at least a first row of antenna elements of a phased array antenna having a plurality of rows and the antenna elements formed as part of the second composite circuit board comprise at least a second row of antenna elements of the phased array antenna having a plurality of rows.

9. The method of claim 8, wherein the first composite circuit board and the second composite circuit board each comprise a single row of antenna elements of the phased array antenna having a plurality of rows.

10. A method for forming an antenna, comprising:
forming antenna elements in a first area of a first rigid circuit board;
forming connective traces and component pads in a second area of the first rigid circuit board, wherein during forming of the antenna elements and during formation of the connective traces a first surface of the first area of the first rigid circuit board defines a plane that is substantially parallel to a plane defined by a first surface of the second area of the first rigid circuit board;
forming transmission lines on a first flexible circuit board;
laminating the first rigid circuit board to the first flexible circuit board to form a first composite circuit board;
after laminating the first rigid circuit board to the first flexible circuit board, removing material provided as part of the first rigid circuit board in a first region of the first rigid circuit board between the first area of the first rigid circuit board and the second area of the first rigid circuit board;
folding the first flexible circuit board in a region adjacent the first region of the first rigid circuit board where material was removed, wherein following folding the first flexible circuit board the first surface of the first area of the first rigid circuit board defines a plane that is at an angle to the first surface of the second area of the first rigid circuit board;
forming antenna elements in a first area of a second rigid circuit board;
forming connective traces and component pads in a second area of the second rigid circuit board, wherein during forming of the antenna elements and during formation of the connective traces a first surface of the first area of the second rigid circuit board defines a plane that is substantially parallel to a plane defined by a first surface of the second area of the second rigid circuit board;
forming transmission lines on a second flexible circuit board;
laminating the second rigid circuit board to the second flexible circuit board to form a second composite circuit board;
after laminating the second rigid circuit board to the second flexible circuit board, removing material provided as part of the second rigid circuit board in a first region of the second rigid circuit board between the first area of the second rigid circuit board and the second area of the second rigid circuit board;
folding the first flexible circuit board in a region adjacent the first region of the second rigid circuit board where material was removed, wherein following folding the second flexible circuit board the first surface of the first area of the second rigid circuit board defines a plane that is at an angle to the first surface of the second area of the second rigid circuit board;
interconnecting the folded first composite circuit board to the folded second composite circuit board, wherein the first composite circuit board comprises at least a first row of antenna elements of a phased array antenna having a plurality of rows and the second composite circuit board comprises at least a second row of antenna elements of the phased array antenna having a plurality of rows.

11. The method of claim 10, wherein interconnecting the folded first composite circuit board to the folded second composite circuit board includes:
interconnecting the folded first composite circuit board to a first housing member;
interconnecting the folded second composite circuit board to the first housing member.

12. The method of claim 11, further comprising:
interconnecting a radome to the folded first and second composite circuit boards, wherein at least a first portion of the radome is opposite the first areas of the first and second composite circuit boards, wherein at least the first portion of the radome is substantially planar and falls within in a plane that is substantially parallel to the first areas of the first and second composite circuit boards.

13. A method for forming an antenna, comprising:

forming antenna elements in a first area of a first rigid circuit board;

forming connective traces and component pads in a second area of the first rigid circuit board, wherein during forming of the antenna elements and during formation of the connective traces a first surface of the first area of the first rigid circuit board defines a plane that is substantially parallel to a plane defined by a first surface of the second area of the first rigid circuit board;

forming transmission lines on a first flexible circuit board;

laminating the first rigid circuit board to the first flexible circuit board to form a first composite circuit board;

after laminating the first rigid circuit board to the first flexible circuit board, removing material provided as part of the first rigid circuit board in a first region of the first rigid circuit board between the first area of the first rigid circuit board and the second area of the first rigid circuit board;

folding the first flexible circuit board in a region adjacent the first region of the first rigid circuit board where material was removed, wherein following folding the first flexible circuit board the first surface of the first area of the first rigid circuit board defines a plane that is at an angle to the first surface of the second area of the first rigid circuit board, wherein the first rigid circuit board comprises a first primary rigid circuit board, the method further comprising:

forming connective traces and component pads on a first auxiliary rigid circuit board;

laminating the first auxiliary rigid circuit board to the first flexible circuit board, wherein at least a portion of the first flexible circuit board is held between at least a portion of the first primary rigid circuit board and the first auxiliary rigid circuit board;

after laminating the first primary circuit board and the first auxiliary circuit board to the first flexible circuit board, removing material provided as part of the first auxiliary rigid circuit board in a first region of the first auxiliary rigid circuit board, wherein at least a portion of the first region of the first auxiliary rigid circuit board corresponds to an area comprising at least a portion of the first region of the first primary circuit board.

14. A phased array antenna component, comprising:

a first flexible circuit board having a number of connective traces;

a first rigid circuit board area defining a first plane and having a plurality of antenna radiating elements formed thereon in at least a first row, wherein the first rigid circuit board area is laminated to the first flexible circuit board, and wherein the antenna elements are formed on said first rigid circuit board area within the first plane;

a second rigid circuit board area defining a second plane and having a number of connective traces and component pads, wherein the second rigid circuit board is laminated to the first flexible circuit board, and wherein a first region of the first flexible circuit board between the first and second rigid circuit boards is folded such that said first and second planes are not parallel to one another.

15. The phased array antenna component of claim 14, wherein the first and second rigid circuit board areas comprise first and second areas of a first rigid circuit board that is physically divided into at least the first and second areas, and wherein the first and second rigid circuit board areas are connected to one another by the first flexible circuit board.

16. A phased array antenna component, comprising:

a first flexible circuit board having a number of connective traces;

a first rigid circuit board area defining a first plane and having a plurality of antenna radiating elements formed thereon in at least a first row wherein the first rigid circuit board area is laminated to the first flexible circuit board, and wherein the antenna elements are formed on said first rigid circuit board area within the first plane;

a second rigid circuit board area defining a second plane and having a number of connective traces and component pads, wherein the second rigid circuit board is laminated to the first flexible circuit board, and wherein a first region of the first flexible circuit board between the first and second rigid circuit boards is folded such that said first and second planes are not parallel to one another;

a third rigid circuit board area defining a third plane, wherein the third rigid circuit board area is laminated to the first flexible circuit board.

17. The phased array antenna component of claim 16, wherein the first rigid circuit board area falls between the second and third rigid circuit board areas, and wherein a second region of the first flexible circuit board between the first and third rigid circuit boards is folded such that said first and third planes are not parallel to one another.

18. The phased array antenna component of claim 17, wherein the second and third rigid circuit board areas are parallel to one another.

19. The phased array antenna component of claim 16, further comprising:

a fourth rigid circuit board area defining a fourth plane, wherein the fourth rigid circuit board area is laminated to the flexible circuit board.

20. A phased array antenna component, comprising:

a first flexible circuit board having a number of connective traces;

a first rigid circuit board area defining a first plane and having a plurality of antenna radiating elements formed thereon in at least a first row, wherein the first rigid circuit board area is laminated to the first flexible circuit board, and wherein the antenna elements are formed on said first rigid circuit board area within the first plane;

a second rigid circuit board area defining a second plane and having a number of connective traces and component pads, wherein the second rigid circuit board is laminated to the first flexible circuit board, and wherein a first region of the first flexible circuit board between the first and second rigid circuit boards is folded such that said first and second planes are not parallel to one another;

a first complementary rigid circuit board area, wherein said first complementary rigid circuit board area defines a plane that is parallel to the first plane defined by the first rigid circuit board area, and wherein at least a portion of the first flexible circuit board is held between the first complementary rigid circuit board area and the first rigid circuit board area.

21. A phased array antenna component, comprising:
a first flexible circuit board having a number of connective traces;
a first rigid circuit board area defining a first plane and having a plurality of antenna radiating elements formed thereon in at least a first row, wherein the first rigid circuit board area is laminated to the first flexible circuit board, and wherein the antenna elements are formed on said first rigid circuit board area within the first plane;
a second rigid circuit board area defining a second plane and having a number of connective traces and component pads, wherein the second rigid circuit board is laminated to the first flexible circuit board, and wherein a first region of the first flexible circuit board between the first and second rigid circuit boards is folded such that said first and second planes are not parallel to one another;
a first complementary rigid circuit board area, wherein said first complementary rigid circuit board area defines a plane that is parallel to the second plane defined by the second rigid circuit board area, and wherein at least a portion of the first flexible circuit board is held between the first complementary rigid circuit board area and the second rigid circuit board area.

22. A phased array antenna, comprising:
a first assembly, including:
first flexible means for forming a circuit;
first rigid means for forming a circuit laminated to the first flexible means for forming a circuit;
a plurality of means for at least one of radiating and receiving radio frequency energy interconnected to the first rigid means for forming a circuit;
second rigid means for forming a circuit laminated to the first flexible means for forming a circuit, wherein the first rigid means for forming a circuit defines a plane that is not parallel to a plane defined by the second rigid means for forming a circuit;
a plurality of means for modifying a radio frequency signal fixed to the second means for forming a circuit;
means for interconnecting at least one of the plurality of means for at least one of radiating and receiving radio frequency energy to at least one of the plurality of means for modifying a radio frequency signal, wherein the means for interconnecting is at least partially provided as part of the first flexible means for forming a circuit.

23. The phased array antenna of claim 22, wherein the phased array antenna includes a number of rows of means for at least one of radiating and receiving radio frequency energy, wherein the first assembly comprises at least a first of the rows.

24. A phased array antenna, comprising:
a first assembly, including:
first flexible means for forming a circuit;
first rigid means for forming a circuit laminated to the first flexible means for forming a circuit;
a plurality of means for at least one of radiating and receiving radio frequency energy interconnected to the first rigid means for forming a circuit;
second rigid means for forming a circuit laminated to the first flexible means for forming a circuit, wherein the first rigid means for forming a circuit defines a plane that is not parallel to a plane defined by the second rigid means for forming a circuit;
a plurality of means for modifying a radio frequency signal fixed to the second means for forming a circuit;
means for interconnecting at least one of the plurality of means for at least one of radiating and receiving radio frequency energy to at least one of the plurality of means for modifying a radio frequency signal, wherein the means for interconnecting is at least partially provided as part of the first flexible means for forming a circuit;
a second assembly, including:
first flexible means for forming a circuit;
first rigid means for forming a circuit laminated to the first flexible means for forming a circuit;
a plurality of means for at least one of radiating and receiving radio frequency energy interconnected to the first rigid means for forming a circuit;
second rigid means for forming a circuit laminated to the first flexible means for forming a circuit, wherein the first rigid means for forming a circuit defines a plane that is not parallel to a plane defined by the second rigid means for forming a circuit;
a plurality of means for modifying a radio frequency signal fixed to the second means for forming a circuit;
means for interconnecting at least one of the plurality of means for at least one of radiating and receiving radio frequency energy to at least one of the plurality of means for modifying a radio frequency signal, wherein the means for interconnecting is at least partially provided as part of the first flexible means for forming a circuit,
wherein the phased array antenna includes a number of rows of means for at least one of radiating and receiving radio frequency energy, wherein the first assembly comprises at least a first of the rows, and wherein the second assembly comprises at least a second of the rows of means for at least one of radiating and receiving radio frequency energy included in the phased array antenna.

25. The phased array antenna of claim 24, further comprising:
means for interconnecting said first and second assemblies, wherein the plane defined by the first rigid means for forming a circuit of the first assembly is held in a first plane by the means for interconnecting, and wherein the plane defined by the first means for forming a circuit of the second assembly is held in the first plane by the means for interconnecting, and wherein the plane defined by the second rigid means for forming a circuit of the first assembly and the plane defined by the second rigid means for forming a circuit of the second assembly are parallel to one another.

26. The phased array antenna of claim 25, wherein the first assembly comprises a first row of means for at least one of radiating and receiving radio frequency energy of the phased array antenna, and wherein the second assembly comprises a second row of means for at least one of radiating and receiving radio frequency energy of the phased array antenna.

* * * * *